United States Patent
Yamauchi et al.

(10) Patent No.: US 11,001,687 B2
(45) Date of Patent: May 11, 2021

(54) SUBSTRATE WITH FUNCTIONAL FINE LINE AND METHOD FOR FORMING FUNCTIONAL FINE LINE

(71) Applicant: Konica Minolta, Inc., Tokyo (JP)

(72) Inventors: Masayoshi Yamauchi, Chofu (JP); Hidenobu Ohya, Hachioji (JP); Takenori Omata, Kokubunji (JP); Naoto Niizuma, Hachioji (JP)

(73) Assignee: Konica Minolta, Inc., Tokyo (JP)

( * ) Notice: Subject to any disclaimer, the term of this patent is extended or adjusted under 35 U.S.C. 154(b) by 170 days.

(21) Appl. No.: 16/326,863

(22) PCT Filed: Aug. 7, 2017

(86) PCT No.: PCT/JP2017/028604
§ 371 (c)(1),
(2) Date: Feb. 20, 2019

(87) PCT Pub. No.: WO2018/043046
PCT Pub. Date: Mar. 8, 2018

(65) Prior Publication Data
US 2019/0194409 A1    Jun. 27, 2019

(30) Foreign Application Priority Data
Aug. 31, 2016    (JP) ............... JP2016-170371

(51) Int. Cl.
*H01B 5/14*    (2006.01)
*C08J 7/04*    (2020.01)
(Continued)

(52) U.S. Cl.
CPC ............ *C08J 7/0423* (2020.01); *B32B 3/14* (2013.01); *B32B 27/36* (2013.01); *C09D 11/033* (2013.01);
(Continued)

(58) Field of Classification Search
CPC ..................................................... C08J 7/0423
(Continued)

(56) References Cited

U.S. PATENT DOCUMENTS

| 2010/0317788 A1* | 12/2010 | Schutyser | C09C 3/10 |
| | | | 524/492 |
| 2014/0333996 A1* | 11/2014 | Saito | G02B 5/282 |
| | | | 359/359 |
| 2019/0106804 A1* | 4/2019 | Granek | C25D 13/22 |

FOREIGN PATENT DOCUMENTS

| CN | 108369836 | 8/2018 |
| JP | 2005095787 A | 4/2005 |

(Continued)

OTHER PUBLICATIONS

International Search Report dated Oct. 24, 2017 filed in PCT/JP2017/028604.

(Continued)

*Primary Examiner* — Stanley Tso
(74) *Attorney, Agent, or Firm* — Rankin, Hill & Clark LLP

(57) ABSTRACT

Provided are a substrate with a functional fine line having excellent optical properties and excellent adhesion of the functional fine line, and a method for forming the functional fine line. The substrate with a functional fine line according to the present invention has an undercoat layer including a hydrophobically modified polyester resin on the substrate, and has a functional fine line including a deposit of functional microparticles and having a line width of 1 μm or more and 10 μm or less on the undercoat layer. The method for forming a functional fine line according to the present invention includes forming an undercoat layer including a hydrophobically modified polyester resin on a substrate, and then forming a functional fine line including a deposit of (Continued)

functional microparticles and having a line width of 1 μm or more and 10 μm or less on the undercoat layer.

20 Claims, 1 Drawing Sheet

(51) Int. Cl.
    *H01L 51/50*     (2006.01)
    *B32B 27/36*     (2006.01)
    *H01B 13/00*     (2006.01)
    *B32B 3/14*     (2006.01)
    *H05K 3/38*     (2006.01)
    *C09D 11/033*     (2014.01)
    *C09D 167/03*     (2006.01)
    *H05K 1/03*     (2006.01)
    *H05K 1/09*     (2006.01)
    *H05K 3/24*     (2006.01)
    *C25D 7/00*     (2006.01)
    *H05K 3/12*     (2006.01)

(52) U.S. Cl.
    CPC ............. *C09D 167/03* (2013.01); *H01B 5/14* (2013.01); *H01B 13/00* (2013.01); *H01L 51/50* (2013.01); *H05K 1/0373* (2013.01); *H05K 1/097* (2013.01); *H05K 3/386* (2013.01); *C08J 2367/02* (2013.01); *C08J 2467/03* (2013.01); *C25D 7/00* (2013.01); *H05K 1/0326* (2013.01); *H05K 3/125* (2013.01); *H05K 3/246* (2013.01); *H05K 2201/0108* (2013.01); *H05K 2201/0145* (2013.01); *H05K 2203/1131* (2013.01)

(58) Field of Classification Search
    USPC ........................................................ 428/143
    See application file for complete search history.

(56) References Cited

FOREIGN PATENT DOCUMENTS

| | | |
|---|---|---|
| JP | 201026000 A | 2/2010 |
| JP | 2015155086 A | 8/2015 |
| WO | 2011051952 A2 | 5/2011 |
| WO | 2017104651 A1 | 6/2017 |

OTHER PUBLICATIONS

Chinese Office Action dated May 19, 2020 issued in the corresponding Chinese patent application No. 201780051574.3 and its English translation.

* cited by examiner

SUBSTRATE WITH FUNCTIONAL FINE LINE AND METHOD FOR FORMING FUNCTIONAL FINE LINE

TECHNICAL FIELD

The present invention relates to a substrate with a functional fine line and a method for forming a functional fine line, and more specifically to a substrate with a functional fine line having excellent optical properties and excellent adhesion of the functional fine line, and a method for forming the functional fine line.

BACKGROUND ART

Patent Literatures 1 and 2 have proposed that functional microparticles contained in an ink applied onto a substrate are deposited on a peripheral part of the ink by utilizing a flow inside the ink to form a functional fine line having a finer width than the application width of the ink.

CITATION LIST

Patent Literature

Patent Literature 1: JP 2005-95787 A
Patent Literature 2: WO 2011/051952 A

SUMMARY OF INVENTION

Technical Problem

However, the functional fine line formed by depositing functional microparticles is easily peeled off from the substrate, and room for further improvement has been found from a viewpoint of adhesion. In addition, room for further improving optical properties of the substrate with a functional fine line has also been found.

Therefore, an object of the present invention is to provide a substrate with a functional fine line having excellent optical properties and excellent adhesion of the functional fine line, and a method for forming the functional fine line.

Other objects of the present invention will become apparent from the following description.

Solution to Problem

The above objects are solved by the following inventions.

1.
A substrate with a functional fine line having an undercoat layer including a hydrophobically modified polyester resin on the substrate, and having a functional fine line including a deposit of functional microparticles and having a line width of 1 μm or more and 10 μm or less on the undercoat layer.

2.
The substrate with a functional fine line according to the invention 1, in which the hydrophobically modified polyester resin is an acrylic modified polyester resin.

3.
The substrate with a functional fine line according to the invention 1 or 2, in which the undercoat layer contains a crosslinking agent.

4.
The substrate with a functional fine line according to the invention 3, in which the crosslinking agent is an oxazoline-based crosslinking agent.

5.
The substrate with a functional fine line according to any one of the inventions 1 to 4, in which the functional microparticles are metal nanoparticles.

6.
The substrate with a functional fine line according to any one of the inventions 1 to 5, in which
the deposit is derived from an ink containing the functional microparticles, water, and a high boiling point solvent having a higher boiling point than water, and
a surface of the undercoat layer satisfies the following contact angle conditions.
[Contact Angle Conditions]
If a contact angle of a mixed solution obtained by mixing water and the high boiling point solvent at a weight ratio of 80:20 at 25° C. with respect to a surface of the undercoat layer is represented by A, and a contact angle of the high boiling point solvent at 25° C. with respect to the surface of the undercoat layer is represented by B, all of the following formulas (a), (b), and (c) are satisfied.

$$0.1 \leq B/A \leq 2 \tag{a}$$

$$10° \leq A \leq 50° \tag{b}$$

$$5° \leq B \leq 30° \tag{c}$$

7.
The substrate with a functional fine line according to the invention 6, in which the high boiling point solvent is diethylene glycol monobutyl ether.

8.
The substrate with a functional fine line according to any one of the inventions 1 to 7, in which a metal is laminated on the functional fine line.

9.
The substrate with a functional fine line according to any one of the inventions 1 to 8, in which the substrate is polycarbonate, a cycloolefin polymer, polystyrene, or glass.

10.
The substrate with a functional fine line according to any one of the inventions 1 to 9, in which a plurality of the functional fine lines forms a predetermined pattern.

11.
A method for forming a functional fine line, including:
forming an undercoat layer including a hydrophobically modified polyester resin on a substrate; and then
forming a functional fine line including a deposit of functional microparticles and having a line width of 1 μm or more and 10 μm or less on the undercoat layer.

12.
The method for forming a functional fine line according to the invention 11, in which the hydrophobically modified polyester resin is an acrylic modified polyester resin.

13.
The method for forming a functional fine line according to the invention 11 or 12, in which the undercoat layer contains a crosslinking agent.

14.
The method for forming a functional fine line according to the invention 13, in which the crosslinking agent is an oxazoline-based crosslinking agent.

15.
The method for forming a functional fine line according to any one of the inventions 11 to 14, in which the functional microparticles are metal nanoparticles.

16.

The method for forming a functional fine line according to any one of the inventions 11 to 15, in which the deposit is derived from an ink containing the functional microparticles, water, and a high boiling point solvent having a higher boiling point than water, and a surface of the undercoat layer satisfies the following contact angle conditions.

[Contact Angle Conditions]

If a contact angle of a mixed solution obtained by mixing water and the high boiling point solvent at a weight ratio of 80:20 at 25° C. with respect to a surface of the undercoat layer is represented by A, and a contact angle of the high boiling point solvent at 25° C. with respect to the surface of the undercoat layer is represented by B, all of the following formulas (a), (b), and (c) are satisfied.

$$0.1 \leq B/A \leq 2 \quad \text{(a)}$$

$$10° \leq A \leq 50° \quad \text{(b)}$$

$$5° \leq B \leq 30° \quad \text{(c)}$$

17.

The method for forming a functional fine line according to the invention 16, in which the high boiling point solvent is diethylene glycol monobutyl ether.

18.

The method for forming a functional fine line according to any one of the inventions 11 to 17, in which a metal is laminated on the functional fine line.

19.

The method for forming a functional fine line according to any one of the inventions 11 to 18, in which the substrate is polycarbonate, a cycloolefin polymer, polystyrene, or glass.

20.

The method for forming a functional fine line according to any one of the inventions 11 to 19, in which a predetermined pattern is formed by a plurality of the functional fine lines.

21.

The method for forming a functional fine line according to any one of the inventions 11 to 20, in which when the functional fine line is formed, the functional microparticles contained in an ink applied onto the undercoat layer are deposited on an edge part of the ink by utilizing a flow inside the ink to form the functional fine line having a finer width than the application width of the ink.

22.

The method for forming a functional fine line according to the invention 21, in which when the functional fine line is formed, the functional microparticles contained in an ink applied onto the undercoat layer as a line segment are deposited on both edge parts of the line segment in a longitudinal direction thereof by utilizing a flow inside the ink to form a pair of the functional fine lines each having a finer width than the application width of the ink.

Advantageous Effects of Invention

The present invention can provide a substrate with a functional fine line having excellent optical properties and excellent adhesion of the functional fine line, and a method for forming the functional fine line.

DESCRIPTION OF EMBODIMENTS

Figure 1A:
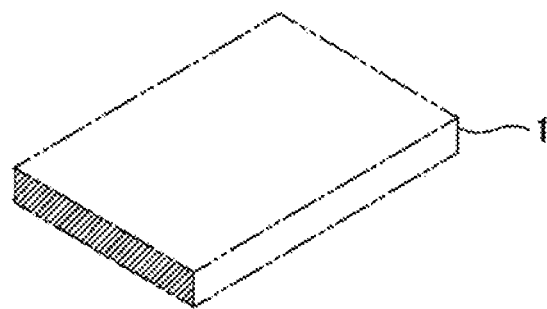
FIG. 1 is a view for explaining an example of a method for forming a functional fine line.

Hereinafter, an embodiment for carrying out the present invention will be described in detail.

First, a substrate with a functional fine line will be described, and then a method for forming a functional fine line will be described. Incidentally, in the following description, a configuration described for a substrate with a functional fine line can be appropriately incorporated into a configuration of a method for forming a functional fine line. In addition, a configuration described for a method for forming a functional fine line can be appropriately incorporated into a configuration of a substrate with a functional fine line.

<Substrate With Functional Fine Line>

The substrate with a functional fine line according to the present invention has an undercoat layer on the substrate and has a functional fine line on the undercoat layer.

The undercoat layer includes a hydrophobically modified polyester resin. The functional fine line includes a deposit of functional microparticles. The functional fine line has a line width of 1 μm or more and 10 μm or less.

Such a substrate with a functional fine line can obtain excellent optical properties and excellent adhesion of the functional fine line. In addition, the substrate with a functional fine line is particularly effective for improving transmittance and reducing haze as optical properties.

<Substrate>

A material of the substrate is not particularly limited, but examples thereof include glass, plastic (polyethylene terephthalate, polybutylene terephthalate, polyethylene, polypropylene, acrylic, polyester, polyamide, polycarbonate, a cycloolefin polymer, ABS, polystyrene, or the like), a metal (copper, nickel, aluminum, iron, or the like, or an alloy), and ceramic. For example, these materials may be used singly or in a state where a plurality of kinds of the materials is bonded to one another.

For example, by using glass, heat resistance of the substrate with a functional fine line can be improved. In addition, for example, by using polycarbonate or a cycloolefin polymer, heat resistance and bending resistance of the substrate with a functional fine line can be improved.

For example, a substrate including plastic or glass, particularly a substrate including polycarbonate, a cycloolefin polymer, polystyrene, or glass has excellent physical properties as a substrate, but inherently hardly adheres to a functional fine line. However, the present invention can cause a functional fine line to strongly adhere even to such a substrate having difficulty in adhesion via an undercoat layer. In addition, due to transparency of the substrate, the effect of the optical properties of the present invention can be more remarkably exhibited.

<Undercoat Layer>

The undercoat layer includes a hydrophobically modified polyester resin.

Examples of the hydrophobically modified polyester resin include a polyester resin into which a hydrophobic group has been introduced. Examples of the hydrophobically modified polyester resin include a resin obtained by bonding or polymerizing one or more kinds of modifying groups each having a hydrophobic group to a polyester resin including one or more kinds of dicarboxylic acids and one or more kinds of diols.

The dicarboxylic acid is not particularly limited, but examples thereof include an aliphatic dicarboxylic acid, an alicyclic dicarboxylic acid, and an aromatic dicarboxylic acid.

Examples of the aliphatic dicarboxylic acid include a saturated aliphatic dicarboxylic acid. Specific examples thereof include succinic acid, adipic acid, sebacic acid, and decamethylenedicarboxylic acid.

Examples of the alicyclic dicarboxylic acid include 1,2-cyclohexane dicarboxylic acid, 1,3-cyclohexane dicarboxylic acid, 1,4-cyclohexane dicarboxylic acid, 1,4-decahydronaphthalene dicarboxylic acid, 1,5-decahydro naphthalene dicarboxylic acid, 2,6-decahydronaphthalene dicarboxylic acid, and 2,7-decahydronaphthalene dicarboxylic acid.

Examples of the aromatic dicarboxylic acid include terephthalic acid and isophthalic acid. Examples of the aromatic dicarboxylic acid further include an aromatic dicarboxylic acid having a sulfonate group. Examples of the aromatic dicarboxylic acid having a sulfonate group include 5-sodium sulfoisophthalic acid, 5-potassium sulfoisophthalic acid, 5-lithium sulfoisophthalic acid, and 5-phosphonium sulfoisophthalic acid.

The diol is not particularly limited, but examples thereof include an aliphatic diol, an alicyclic diol, and a diol having a fluorene skeleton.

Examples of the aliphatic diol include ethylene glycol, propylene glycol, butanediol, pentanediol, and hexanediol.

Examples of the alicyclic diol include a 5-membered ring diol such as 1,2-cyclopentane dimethanol, 1,3-cyclopentane dimethanol, bis(hydroxymethyl) tricyclor [5.2.1.0] decane, and a 6-membered ring diol such as 1,2-cyclohexanediol, 1,3-cyclohexanediol, 1,4-cyclohexanediol, 1,2-cyclohexanedimethanol, 1,3-cyclohexanedimethanol, 1,4-cyclohexanedimethanol, or 2,2-bis(4-hydroxycyclohexyl)-propane.

Examples of the diol having a fluorene skeleton include 9,9-bis[4-(2-hydroxyethoxy) phenyl] fluorene, 9,9-bis[4-(2-hydroxyethoxy)-3-methylphenyl] fluorene, 9,9-bis[4-(2-hydroxyethoxy)-3,5-dimethylphenyl] fluorene, 9,9-bis[4-(2-hydroxyethoxy)-3-ethylphenyl] fluorene, 9,9-bis[4-(2-hydroxyethoxy)-3,5-diethylphenyl] fluorene, 9,9-bis[4-(2-hydroxyethoxy)-3-propylphenyl] fluorene, 9,9-bis[4-(2-hydroxyethoxy)-3,5-dipropylphenyl] fluorene, 9,9-bis[4-(2-hydroxyethoxy)-3-isopropylphenyl] fluorene, 9,9-bis[4-(2-hydroxyethoxy)-3,5-diisopropylphenyl] fluorene, 9,9-bis[4-(2-hydroxyethoxy)-3-n-butylphenyl] fluorene, 9,9-bis[4-(2-hydroxyethoxy)-3,5-di-n-butylphenyl] fluorene, 9,9-bis[4-(2-hydroxyethoxy)-3-isobutylphenyl] fluorene, 9,9-bis[4-(2-hydroxyethoxy)-3,5-diisobutylphenyl] fluorene, 9,9-bis[4-(2-hydroxyethoxy)-3-(1-methylpropyl) phenyl] fluorene, 9,9-bis[4-(2-hydroxyethoxy)-3,5-bis(1-methylpropyl) phenyl] fluorene, 9,9-bis[4-(2-hydroxyethoxy)-3-phenylphenyl] fluorene, 9,9-bis[4-(2-hydroxyethoxy)-3,5-diphenylphenyl] fluorene, 9,9-bis[4-(2-hydroxyethoxy)-3-benzylphenyl] fluorene, 9,9-bis[4-(2-hydroxyethoxy)-3,5-dibenzylphenyl] fluorene, 9,9-bis[4-(3-hydroxypropoxy) phenyl] fluorene, and 9,9-bis[4-(4-hydroxybutoxy) phenyl] fluorene.

The hydrophobic group included in the modifying group is not particularly limited as long as having low affinity (high hydrophobicity) to water or a polar solvent, and examples thereof include: an organic fluorine compound group such as a polyfluoroalkyl group or a polyfluoroether alkyl group; an organosilicon compound such as an organopolysiloxane group, a trimethylsilyl group, or a dimethylsilylene group; and a long chain alkyl group having 5 to 20 carbon atoms. As the modifying group, a group mainly including these hydrophobic groups can be used. Preferably, the modifying group has a small number of hydrophilic groups or no hydrophilic group.

A method for introducing the modifying group into the polyester resin is not limited, and examples thereof include a method for polymerizing the modifying group to the polyester resin. In a case of using the polymerization method, for example, the polyester resin may be polymerized in the presence of the modifying group, or the modifying group may be polymerized after the polyester resin is polymerized. The polymerization method is not particularly limited, and examples thereof include graft polymerization.

The hydrophobically modified polyester resin is preferably an acrylic modified polyester resin. This can reduce haze (cloudiness) of the undercoat layer, and can further improve the optical properties of the whole substrate with a functional fine line.

For obtaining the acrylic modified polyester resin, an acrylic resin (hydrophobic acrylic resin) having enhanced hydrophobicity can be used as the modifying group.

A method for enhancing the hydrophobicity of the acrylic resin is not particularly limited, but examples thereof include a method for increasing the ratio of an acrylic monomer having a hydrophobic group (for example, a long chain alkyl group) and reducing the ratio of an acrylic monomer having a hydrophilic group (for example, a carboxyl group) in a side chain or a reactive group.

Examples of the acrylic monomer include acrylic acid, methyl acrylate, ethyl acrylate, butyl acrylate, sodium acrylate, ammonium acrylate, methacrylic acid, methyl methacrylate, ethyl methacrylate, butyl methacrylate, glycidyl methacrylate, acrylamide, methacryl amide, N-methoxymethyl acrylamide, N-methylol acrylamide, and 2-hydroxyethyl acrylate.

The acrylic resin used as the modifying group may further include, for example, styrene, α-methylstyrene, sodium styrenesulfonate, sodium vinylsulfonate, sodium methacrylate, vinyl chloride, vinylidene chloride, vinyl ether, or vinyl acetate as a copolymerizable component.

A modification ratio of the hydrophobically modified polyester resin can be appropriately set in consideration of the degree of hydrophobicity of the modifying group and the like, but can be set to 10% to 70%, for example. If the modification ratio is within the above range, formation of a functional fine line is stabilized, disconnection of the functional fine line is prevented, and furthermore, adhesion is improved. Note that the modification ratio (%) is a percentage of the weight of the modifying group with respect to the weight of the hydrophobically modified polyester resin.

<Crosslinking Agent>

The undercoat layer preferably contains a crosslinking agent. This further improves adhesion between the undercoat layer and the functional fine line. A method for forming a functional fine line will be described later in detail, and a functional fine line having a fine line width can be formed more stably on the undercoat layer by using a crosslinking agent.

The crosslinking agent contained in the undercoat layer may be any one as long as being able to crosslink a polyester resin constituting the undercoat layer, and examples thereof include oxazoline-based, isocyanate-based, carbodiimide-based, melamine-based, and epoxy-based crosslinking agents. Among these crosslinking agents, an oxazoline-based crosslinking agent is suitable. By using an oxazoline-based crosslinking agent, adhesion between the undercoat layer and the functional fine line is remarkably improved.

Examples of the oxazoline-based crosslinking agent include a crosslinking agent having an oxazoline group.

Examples of the crosslinking agent having an oxazoline group include a polymer containing a monomer having an oxazoline group.

Examples of the monomer having an oxazoline group include 2-vinyl-2-oxazoline, 2-vinyl-4-methyl-2-oxazoline, 2-vinyl-5-methyl oxazoline, 2-isopropenyl-2-oxazoline, 2-isopropenyl-4-methyl-2-oxazoline, and 2-isopropenyl-5-methyl-2-oxazoline.

Examples of the polymer containing a monomer having an oxazoline group (also referred to as a resin crosslinking agent) include an acrylic resin crosslinking agent having an oxazoline group.

Examples of the acrylic resin crosslinking agent having an oxazoline group include an acrylic resin containing water or a small amount of organic solvent and having solubility or dispersibility in water. Examples of such an acrylic resin include an acrylic resin obtained by copolymerizing the above-described monomer having an oxazoline group with another copolymerizable component. Examples of the other copolymerizable component of the acrylic resin include a monomer component such as alkyl (meth)acrylate or (meth) acrylamide.

In addition to the above-described monomers, the acrylic resin crosslinking agent having an oxazoline group may further contain a monomer having a polyalkylene oxide chain.

Examples of the monomer having a polyalkylene oxide chain include an ester obtained by adding a polyalkylene oxide to a carboxyl group of acrylic acid or methacrylic acid. Here, examples of the polyalkylene oxide chain include polymethylene oxide, polyethylene oxide, polypropylene oxide, and polybutylene oxide. A repeating unit of the polyalkylene oxide chain can be, for example, in a range of 3 to 100.

Specific examples of the acrylic resin crosslinking agent include a copolymer of 2-isopropenyl-2-oxazoline and methyl methacrylate.

The amount of the crosslinking agent to be added can be, for example, in a range of 3 wt % to 12 wt % with respect to the total weight of the undercoat layer. By setting the amount to be added to 3 wt % or more, an effect of crosslinking is sufficiently exhibited, and adhesion between the undercoat layer and the functional fine line can be suitably improved. In addition, by setting the amount to be added to 12 wt % or less, the undercoat layer is prevented from being excessively hydrophilized by an oxazoline group and/or a polyalkylene oxide chain, wettability of an ink can be suitably maintained, and the functional fine line can be stably formed Particularly, it is possible to favorably stabilize formation of a functional fine line using a coffee stain phenomenon described later, and to narrow the line width of an obtained functional fine line.

<Functional Fine Line>

The functional fine line includes a deposit (also referred to as an aggregate or an assembly) of functional microparticles.

As the functional microparticles, a particulate functional material can be used. The functional material is not particularly limited as long as being a material for imparting a specific function to a substrate. Imparting a specific function means, for example, imparting conductivity to a substrate using a conductive material and imparting an insulating property to a substrate using an insulating material. As the functional material, for example, a conductive material, an insulating material, a semiconductor material, an optical material (for example, an optical filter material), a dielectric material, or a magnetic material can be used according to a required function. The functional material is preferably a material different from a material constituting a surface of a substrate onto which the functional material is applied.

Particularly, conductive microparticles (conductive material) can be preferably used as the functional microparticles.

The conductive microparticles are not particularly limited, but preferable examples thereof include metal microparticles such as Au, Pt, Ag, Cu, Ni, Cr, Rh, Pd, Zn, Co, Mo, Ru, W, Os, Ir, Fe, Mn, Ge, Sn, Ga, and In. Among these microparticles, by using metal microparticles such as Au, Ag, and Cu, a fine line having low electric resistance and high resistance to corrosion can be formed. Metal microparticles containing Ag are particularly preferable from viewpoints of cost and stability. These metal microparticles are preferably metal nanoparticles, and an average particle diameter thereof is preferably in a range of 1 to 100 µm, and more preferably in a range of 3 to 50 nm. The average particle diameter is a volume average particle diameter, which can be measured by Zetasizer 1000HS manufactured, by Malvern Instruments.

In addition, the conductive microparticles may be carbon microparticles. Examples of the carbon microparticles include graphite microparticles, carbon nanotube, and fullerene.

In addition, the conductive microparticles may be formed of a conductive polymer. Examples of the conductive polymer include a π-conjugated conductive polymer. Examples of the π-conjugated conductive polymer include a chain conductive polymer such as a polythiophene, a polypyrrole, a polyindole, a polycarbazole, a polyaniline, a polyacetylene, a polyfuran, a polyparaphenylene, a polyparaphenylenevinylene, a polyparaphenylene sulfide, a polyazulene, a polyisothianaphthene, or a polythiazyl.

By setting the line width of the functional fine line to 1 µm or more, a function of the functional fine line can be exhibited favorably. In addition, by setting the line width of the functional fine line to 10 µm or less, visibility of the functional fine line can be lowered, and transmittance can be improved. Particularly, in a case where the line width is 10 µm or less, even when a material itself (functional microparticles or the like) constituting the fine line is not transparent, the material visually looks transparent. Here, the term "transparent" includes not only a case where a material itself is transparent but also a case where a material visually looks transparent.

Even a fine functional fine line having a line width of 1 µm or more and 10 µm or less can be stably held on the substrate via the above-described undercoat layer with high adhesion. The substrate including the undercoat layer can stably form a fine functional fine line having a line width of 1 µm or more and 10 µm or less on the undercoat layer.

(Method for Forming Functional Fine Line)

The method for forming a functional fine line according to the present invention includes forming an undercoat layer on a substrate, and then forming a functional fine line on the undercoat layer.

The undercoat layer includes a hydrophobically modified polyester resin. The functional fine line includes a deposit of functional microparticles. The functional fine line has a line width of 1 µm or more and 10 µm or less.

According to such a method for forming a functional fine line, excellent optical properties of an obtained substrate with a functional fine line and excellent adhesion of a functional fine line can be obtained. In addition, the method is particularly effective for improving transmittance and reducing haze as optical properties. The substrate including the undercoat layer can stably form a fine functional fine line having a line width of 1 µm or more and 10 µm or less on the undercoat layer.

The functional fine line can be formed by a wet process for depositing the functional microparticles on the undercoat layer from a liquid (also referred to as an ink) containing the functional microparticles applied onto the undercoat layer. At this time, the liquid can be removed appropriately. The liquid may be removed in parallel with progress of the deposition or may be removed after deposition is completed. As such a process, for example, a printing method or the like can be preferably used.

Examples of the printing method include a gravure offset printing method, a screen printing method, and an inkjet method.

As the inkjet method, for example, by setting the application width of an ink to 1 µm or more and 10 µm or less using a super inkjet capable of ejecting small droplets smaller than ordinary droplets, a functional fine line having a line width of 1 µm or more and 10 µm or less can be directly formed.

In addition, by utilizing a coffee stain phenomenon, functional microparticles contained in an ink applied onto the undercoat layer are deposited on an edge part of the ink by utilizing a flow inside the ink to form a functional fine line having a finer width than the application width of the ink. As a result, it is possible to form a functional fine line having a line width of 1 µm or more and 10 µm or less irrespective of the application width of an ink. Therefore, a wet process such as an ordinary inkjet method, a dispenser method, or the above-described various printing methods can be used with high versatility.

<Method for Forming Functional Fine Line Using Coffee Stain Phenomenon>

An example of a method for forming a functional fine line using a coffee stain phenomenon will be described below with reference to FIG. 1.

First, as illustrated in FIG. 1A, a substrate 1 is prepared.

The substrate 1 can be subjected to a surface treatment if necessary. Particularly, examples of a surface treatment suitable for a substrate including plastic include a corona discharge treatment. The corona discharge treatment can hydrophilize a surface of the substrate 1 and can improve coatability of a coating solution for forming an undercoat layer.

Figure 1B:
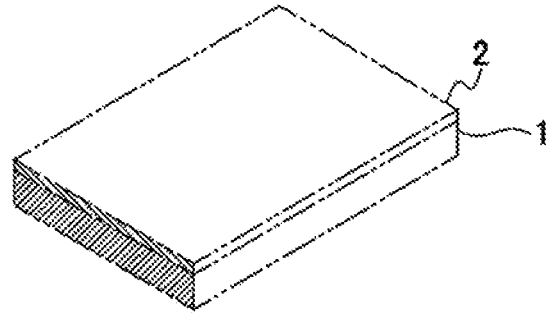

Next, as illustrated in FIG. 1B, an undercoat layer 2 is formed on the substrate 1.

The method for forming the undercoat layer 2 is not particularly limited. However, for example, the undercoat layer 2 is preferably formed by a coating method. The coating method is not particularly limited, and examples thereof include a coating method with a wire bar. In a case of using the coating method, a coating solution containing a component for forming the undercoat layer 2 in a solvent is prepared and applied onto the substrate 1. Thereafter, the solvent is dried to form the undercoat layer 2. Examples of the solvent include water and an organic solvent, and water is particularly suitable.

In a case where the undercoat layer 2 contains a crosslinking agent, a treatment for advancing a crosslinking reaction can be appropriately perforated.

Note that an intermediate layer (not illustrated) may be disposed between the substrate 1 and the undercoat layer 2.

Subsequently, as illustrated, in FIG. 1C, an ink 3 containing functional microparticles is applied onto the undercoat layer 2.

Figure 1C:
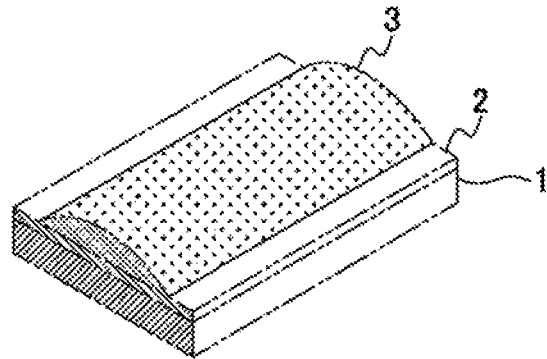
Figure 1D:
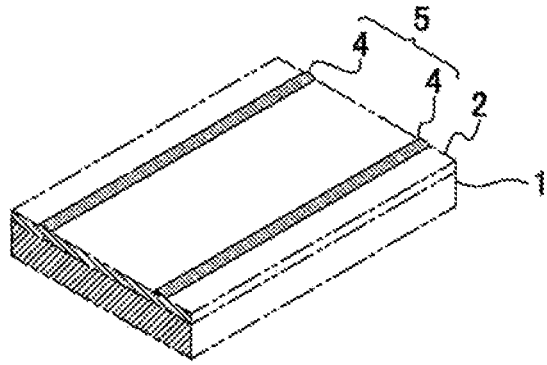

Subsequently, as illustrated in FIG. 1D, functional microparticles contained in the ink 3 applied onto the undercoat layer 2 are deposited on an edge part of the ink 3 by utilizing a flow inside the ink 3 to form a functional fine line 4 having a finer width than the application width of the ink 3.

That is, due to drying of the ink 3, a flow from the central part to the edge part of the ink 3 occurs so as to compensate for a liquid lost by evaporation at the edge part. By this flow, the functional microparticles are carried to the edge part and deposited. This flow can be caused by fixing of a contact line of the ink 3 due to drying and a difference in evaporation amount between the central part and the edge part of the ink 3. Therefore, the concentration of the conductive material, the contact angle between the ink 3 and the undercoat layer 2, the liquid amount of the ink 3, the disposition density of the ink 3, or an environmental factor such as temperature, humidity, or atmospheric pressure is preferably set so as to promote this flow.

Here, by applying the ink 3 as a line segment, the functional fine lines 4 and 4 are formed on both edge parts of the line segment in a longitudinal direction thereof. In this way, it is possible to form parallel lines 5 including a pair of functional fine lines 4 and 4. This makes it possible to improve productivity in forming a functional fine line.

<Ink>

As the ink, a liquid containing the functional microparticles can be used. The liquid can be constituted by one kind or a combination of two or more kinds selected from water, an organic solvent, and the like.

The organic solvent is not particularly limited, but examples thereof include an alcohol such as 1,2-hexanediol, 2-methyl-2,4-pentanediol, 1,3-butanediol, 1,4-butanediol, or propylene glycol, and an ether such as diethylene glycol monomethyl ether, diethylene glycol monoethyl ether, diethylene glycol monobutyl ether, triethylene glycol monomethyl ether, dipropylene glycol monomethyl ether, or dipropylene glycol monoethyl ether.

The ink may contain various additives such as a surfactant. The surfactant is not particularly limited, but examples thereof include a silicone-based surfactant. The silicone-based surfactant is obtained by polyether-modifying a side chain or a terminal of dimethylpolysiloxane. For example, "KF-351A and KF-642" manufactured by Shin-Etsu Chemical Co., Ltd. and "BYK 347 and BYK 348" manufactured by BYK Japan KK are commercially available. The amount of the surfactant to be added is preferably 1 wt % or less with respect to the total amount of a liquid forming a line-shaped liquid 24.

The concentration of the functional microparticles in the ink is not particularly limited. However, in a case of using the above-described coffee stain phenomenon, the concentration can be adjusted to 0.01 wt % or more and 1.0 wt % or less, for example.

As described above, the functional fine line, that is, the deposit of functional microparticles can be a deposit derived from an ink. In this case, the ink preferably contains functional microparticles, water, and a high boiling point solvent having a higher boiling point than water. The high boiling point solvent is preferably diethylene glycol monobutyl ether, for example. This makes it possible to reduce the line width of a functional fine line formed particularly by using the coffee stain phenomenon.

By crosslinking the polyester resin constituting the undercoat layer with the above-described crosslinking agent, the contact angle of the high boiling point solvent with respect to the undercoat layer is increased. As a result, a difference between a contact angle of an ink containing water and a high boiling point solvent at an initial stage of drying with respect to the undercoat layer and a contact angle of an ink mainly containing a high boiling point solvent at a later stage of drying with respect to the undercoat layer is reduced. This prevents a change in contact angle due to progress of drying and prevents movement of a peripheral pad of an ink due to progress of drying. Therefore, the line width of a functional fine line including functional microparticles deposited on a peripheral part can be remarkably reduced.

In a case where the ink contains functional microparticles, water, and a high boiling point solvent having a higher boiling point than water, a surface of the undercoat layer preferably satisfies the following contact angle conditions. This makes it possible to reduce the line width of a functional fine line formed particularly by using the coffee stain phenomenon.

[Contact Angle Conditions]

If a contact angle of a mixed solution obtained by mixing water and a high boiling point solvent at a weight ratio of 80:20 at 25° C. with respect to a surface of an undercoat layer is represented by A, and a contact angle of the high boiling point solvent at 25° C. with respect to the surface of the undercoat layer is represented by B, all of the following formulas (a), (b), and (c) are satisfied.

$$0.1 \leq B/A \leq 2 \quad (a)$$

$$10° \leq A \leq 50° \quad (b)$$

$$5° \leq B \leq 30° \quad (c)$$

Here, the high boiling point solvent is a high boiling point solvent having a higher boiling point than water to be contained in an ink used for forming a conductive fine line. In a case where two or more kinds of high boiling point solvents are contained in an ink, as a high boiling point solvent under the contact angle conditions, two or more kinds of high boiling point solvents similar to those contained in the ink are blended and used at a similar weight ratio. For example, in a case of using an ink containing 15 wt % of a high boiling point solvent α and 10 wt % of a high boiling point solvent β, the composition of a "mixed solution obtained by mixing water and the high boiling point solvent at a weight ratio of 80:20" used for measurement of the contact angle A under the contact angle conditions is a weight ratio of water:high boiling point solvent α:high boiling point solvent β=80:12:8, and the composition of a "high boiling point solvent" used for measurement of the contact angle B under the contact angle conditions is a weight ratio of high boiling point solvent α:high boiling point solvent β=60:40. For measurement of a contact angle, 3 μL of a droplet is dropped, and a value one second after dropping is taken as a measured value.

By satisfying the contact angle conditions, a difference between a contact angle of an ink at an initial stage of drying with respect to the undercoat layer and a contact angle of the ink at a later stage of drying with respect to the undercoat layer is reduced. Furthermore, a value of the contact angle in the drying process is suitable for depositing functional microparticles on a peripheral part of the ink. Therefore, it is possible to further reduce the line width of the functional fine line.

Other Embodiments

Hereinafter, other embodiments of the present invention will be described.

<Metal Lamination>

A metal is preferably laminated on the functional fine line. The metal can be laminated as a metal film on the functional fine line. The metal film is preferably formed by electroless plating or electrolytic plating. By selecting conductivity as a function to be imparted to the functional fine line, a metal film can be selectively formed on the functional fine line by utilizing conductivity of the functional fine line A metal constituting the metal film is preferably different from a material (functional microparticles) constituting the functional fine line. For example, the functional fine line can be made of silver (for example, silver microparticles), and the metal film can be made of copper, nickel, chromium, or the like.

Plating may be performed a plurality of times with different plating metals. This makes it possible to form a plurality of metal films on the functional fine line.

For example, by forming a first metal film including copper and a second metal film including nickel or chromium on the functional fine line, conductivity can be improved by copper, and weather resistance can be improved by nickel or chromium. In addition, by coating a metal having a strong color tone, such as copper, with nickel or chromium, the strong color tone disappears to become a neutral color, and it is difficult to visually recognize the functional fine line.

In a case of laminating a metal by plating, it has been confirmed that the metal is mainly laminated in a height direction. Therefore, it is possible to suppress thickening of a functional fine line due to plating. As a result, the line width of a fine line formed of a composite of a functional fine line and a laminated metal can suitably maintain a sufficiently fine width (preferably 10 μm or less although depending on plating conditions). As a result, it is possible to maintain optical properties favorably. In addition, even after plating, adhesion of the functional fine line can be maintained favorably.

<Formation on Both Surfaces>

In the above description, the case where an undercoat layer is formed on one surface of a substrate, and a functional fine line is formed on the undercoat layer has been described, but the present invention is not limited thereto. For example, an undercoat layer may be formed on each surface of a substrate, and a functional fine line may be formed on an undercoat layer on each surface.

<Other Example of Method for Forming Functional Fine Line Using Coffee Stain Phenomenon>

In the above description, as an example of the coffee stain phenomenon, the case where a line-shaped functional fine line is formed on each of edge parts of a line segment in a length direction thereof by applying an ink as the line segment has been mainly described, but the present invention is not limited thereto.

Functional fine lines of various desired shapes can be formed depending on the application shape of an ink. For example, it is also possible to form a circular (ring-shaped) functional fine line in a peripheral part (circumferential part) of an ink by applying the ink in a circular shape. The application shape of the ink can be freely set, for example, can be set to a polygonal shape, a wavy line shape, a polygonal line shape, or the like, in addition to a circular shape, and functional fine lines corresponding to these shapes can be obtained.

The coffee stain phenomenon is not limited to a case where functional microparticles are deposited over the entire circumference of a peripheral part of an ink. For example, functional microparticles may be selectively deposited only on a part of a peripheral part of an ink.

A site where the functional microparticles are deposited can be selected, for example, by controlling a flow inside an ink. While an ink is dried, for example, by forming a local difference in temperature inside the ink and increasing an ink evaporation amount on a part of a peripheral part of the ink, functional microparticles can be selectively deposited on the part of the peripheral part. Using this method, for example, it is also possible to increase the ink evaporation amount at one edge part of a line-shaped ink in a length direction thereof to form one functional fine line from one line-shaped ink.

<Functional Fine Line Pattern>

A predetermined pattern (functional fine line pattern) is preferably formed with a plurality of functional fine lines. By combining a plurality of functional fine lines, for example, it is possible to form various patterns each having regularity, such as a stripe shape and a mesh shape. The pattern does not have to have regularity, and a plurality of functional fine lines may be randomly formed (disposed) to form a random pattern.

<Use>

A functional fine line, a functional fine line pattern, and a substrate with a functional fine line can be used for various purposes depending on a function to be imparted without any particular limitation.

For example, a conductive fine line having conductivity as a function of a functional fine line can be used as an electric wire or the like constituting an electric circuit. An undercoat layer including a polyester resin can be suitably used as an insulating layer, and therefore a plurality of independent electric wires can be formed on the undercoat layer.

In addition, for example, a functional fine line pattern (conductive fine line assembly) including a plurality of conductive fine lines can be used as one transparent conductive film (transparent conductor or planar transparent electrode).

In this way, a conductive fine line, a conductive fine line pattern, and a substrate with a conductive fine line can be used for various devices included in various electronic devices.

In addition, a functional fine line and a functional fine line patterns have excellent transparency, can further impart transparency also to a substrate and a base layer, and therefore can be used for various devices requiring transparency.

Examples of a use of a substrate with a conductive fine line pattern include transparent electrodes for various types displays such as a liquid crystal, a plasma, an organic electroluminescence, and a field emission, and transparent electrodes used for a touch panel, a mobile phone, electronic paper, various solar cells, various electroluminescence light control elements, and the like. A substrate with a conductive fine line pattern is particularly preferably used as a touch panel sensor of an electronic device such as a smartphone or a tablet terminal. In a case where the substrate is used as a touch panel sensor, a transparent conductive film can be used as a position detection electrode (X electrode and Y electrode).

EXAMPLES

Hereinafter, Examples of the present invention will be described, but the present invention is not limited by the Examples.

Example 1

1. Preparation of Substrate With Functional Fine Line (1) Preparation of Substrate One surface of a polyethylene terephthalate (PET) film having a thickness of 125 μm was subjected to a corona discharge treatment to prepare a substrate.

(2) Preparation of Polyester Resin A (Synthesis)

Polysiloxane was polymerized to polyester resin a having the following composition ratio at a modification ratio of 20% to prepare hydrophobically modified (siloxane-modified) polyester resin A.

[Polyester Resin a]

Terephthalic acid (dicarboxylic acid component): 30 mol %

Isophthalic acid (dicarboxylic acid component): 14 mol %

5-Sulfoisophthalic acid (dicarboxylic acid component): 2 mol %

Ethylene glycol (glycol component): 34 mol %

Bisphenol A (glycol component): 20 mol %

(3) Preparation of Coating Solution

The polyester resin A was adjusted to a solid content concentration of 5 wt % with pure water to prepare a coating solution.

(4) Formation of Undercoat Layer

The coating solution was applied to the surface of the substrate that had been subjected to the corona discharge treatment with a wire bar so as to have a wet film thickness of 3 μm (dry film thickness of 0.15 μm), and then dried at 100° C., for three minutes to form an undercoat layer. The composition of the undercoat layer is as illustrated in Table 1.

(5) Preparation of Ink

An ink having the following composition was prepared.

[Ink Composition]

Aqueous dispersion 1 of silver nanoparticles (silver nanoparticles: 40 wt %): 1.75 wt %

Diethylene glycol monobutyl ether: 20 wt %

Pure water: balance

The above-described contact angle conditions are as illustrated in Table 1. Here, the high boiling point solvent is diethylene glycol monobutyl ether.

(6) Formation of Functional Fine Line Pattern

Using the ink, a functional fine line pattern (mesh pattern) including a plurality of functional fine lines was formed on a substrate.

Specifically, first, using an XY robot ("SHOTMASTER300" manufactured by Musashi Engineering, Inc.) equipped with an inkjet head "512LHX" (standard droplet capacity 42 pL) manufactured by Konica Minolta, Inc. and an inkjet control system ("IJCS-1" manufactured by Konica Minolta, Inc.), the ink was sequentially ejected as droplets onto an undercoat layer disposed on one surface of a substrate such that a pitch of the ink in a nozzle array direction was 282 μm and a pitch of the ink in a scanning direction was 45 and the droplets continuously applied onto the undercoat layer in the scanning direction were unified to form a plurality of first line-shaped inks 3 (FIG. 1C). Incidentally, by heating a stage on which the substrate was placed at 70° C. during printing and depositing a solid on an edge part (both edge parts in a longitudinal direction) in a course of drying the line-shaped inks 3, first parallel lines 5 including two (a pair of) functional fine lines 4 and 4 containing functional microparticles were formed from one of the line-shaped inks 3.

Thereafter, the substrate was rotated by 90°, and a plurality of second line-shaped inks 3 formed of the ink were applied and dried in a direction orthogonal to the first parallel lines 5 in a similar manner to that described above to form second parallel lines 5. In this way, a functional fine line pattern formed of a mesh pattern was formed.

(5) Firing Treatment

The substrate on which a functional fine line pattern had been formed was put in an oven at 130° C. and fired for 10 minutes.

In this way, a substrate with a functional fine line was prepared.

Example 2

A substrate with a functional fine line was prepared in a similar manner to Example 1 except that polyester resin A was replaced by polyester resin B prepared as described below in Example 1.

<Preparation of Polyester Resin B>

An acrylic component having the following composition ratio was polymerized to polyester resin b having the following composition ratio at a modification ratio of 50% to prepare hydrophobically modified (acrylic modified) polyester resin B.

[Polyester Resin b]
Terephthalic acid (dicarboxylic acid component): 30 mol %
Isophthalic acid (dicarboxylic acid component): 14 mol %
5-Sulfoisophthalic acid (dicarboxylic acid component): 2 mol %
Ethylene glycol (glycol component): 34 mol %
Bisphenol A (glycol component): 20 mol %
[Acrylic Component]
Glycidyl methacrylate: 20 mol %
Methyl methacrylate: 40 mol %
Styrene: 10 mol %
Butyl acrylate: 30 mol %

Example 3

A substrate with a functional fine line was prepared in a similar manner to Example 2 except that a carbodiimide-based crosslinking agent was blended in the following formulation in the coating solution in Example 2.

<Formulation of Coating Solution>
Modified polyester resin B: 5 wt %
Carbodiimide-based crosslinking agent (Carbodilite SV-02 manufactured by Nisshinbo Chemical Inc.: solid content concentration 40 wt %): 1 wt %
Pure water: balance

Example 4

A substrate with a functional fine line was prepared in a similar manner to Example 3 except that an oxazoline-based crosslinking agent was blended in the following formulation in place of the carbodiimide-based crosslinking agent of the coating solution in Example 3.

<Formulation of Coating Solution>
Modified polyester resin B: 5 wt %
Oxazoline-based crosslinking agent (Epocross WS-700 manufactured by Nippon Shokubai Co., Ltd.: solid content concentration 25 wt %): 1.6 wt %
Pure water: balance

Example 5

A substrate with a functional fine line was prepared in a similar manner to Example 1 except that polyester resin A was replaced by polyester resin C prepared as described below in Example 1.

<Preparation of Polyester Resin C>

An acrylic component having the following composition ratio was polymerized to polyester resin c having the following composition ratio at a modification ratio of 30% to prepare hydrophobically modified (acrylic modified) polyester resin C.

[Polyester Resin c]
Terephthalic acid (dicarboxylic acid component): 30 mol %
Isophthalic acid (dicarboxylic acid component): 14 mol %
5-Sulfoisophthalic acid (dicarboxylic acid component): 2 mol %
Ethylene glycol (glycol component): 34 mol %
Bisphenol A (glycol component): 20 mol %
[Acrylic Component]
Glycidyl methacrylate: 20 mol %
Methyl methacrylate: 40 mol %
Styrene: 10 mol %
Butyl acrylate: 30 mol %

Example 6

A substrate with a functional fine line was prepared in a similar manner to Example 1 except that polyester resin A was replaced by polyester resin D prepared as described below in Example 1.

<Preparation of Polyester Resin D>

Polysiloxane was polymerized to polyester resin d having the following composition ratio at a modification ratio of 40% to prepare hydrophobically modified (siloxane-modified) polyester resin D.

[Polyester Resin d]
Terephthalic acid (dicarboxylic acid component): 30 mol %
Isophthalic acid (dicarboxylic acid component): 14 mol %
5-Sulfoisophthalic acid (dicarboxylic acid component): 2 mol %
Ethylene glycol (glycol component): 34 mol %
Bisphenol A (glycol component): 20 mol %

Example 7

A substrate with a functional fine line was prepared in a similar manner to Example 4 except that the substrate was replaced by a polycarbonate (PC) film having a thickness of 100 μm in Example 4.

Example 8

A substrate with a functional fine line was prepared in a similar manner to Example 4 except that the substrate was replaced by non-alkali glass having a thickness of 0.8 mm in Example 4.

Example 9

A substrate with a functional fine line was prepared in a similar manner to Example 4 except that the substrate was replaced by a cycloolefin polymer (COP) film having a thickness of 100 μm in Example 4.

Comparative Example 1

A substrate with a functional fine line was prepared in a similar manner to Example 1 except that polyester resin A was replaced by polyester resin E prepared as described below in Example 1.
<Preparation of Polyester Resin E>
(Not hydrophobically modified) polyester resin E having the following composition ratio was prepared.
[Polyester Resin E]
Terephthalic acid (dicarboxylic acid component): 30 mol %
Isophthalic acid (dicarboxylic acid component): 14 mol %
5-Sulfoisophthalic acid (dicarboxylic acid component): 2 mol %
Ethylene glycol (glycol component): 34 mol %
Bisphenol A (glycol component): 20 mol %

Comparative Example 2

A substrate with a functional fine line was prepared in a similar manner to Example 1 except that a pattern was directly formed on the substrate by omitting formation of an undercoat layer in Example 1.

Comparative Example 3

A substrate with a functional fine line was prepared in a similar manner to Example 7 except that a pattern was directly formed on the substrate by omitting formation of an undercoat layer in Example 7.

2. Evaluation Method (1) Method for Measuring Line Width of Conductive Fine Line The line width of a functional fine line was measured using an optical microscope. The line width was taken as an average value of the line widths measured at arbitrary 10 points.

The line width of the functional fine line can be an index to evaluate stability of the coffee stain phenomenon. That is, as the line width of the functional fine line is thinner, selective deposition of functional microparticles on an ink peripheral part is further promoted, and evaluation that the coffee stain phenomenon is stabilized can be made.

Incidentally, in Comparative Examples 1 to 3, functional microparticles were dispersed throughout the application width of a line-shaped ink, and the line width of a functional fine line exceeded 10 μm. Therefore, Comparative Examples 1 to 3 were evaluated to be "N.G.".

(2) Method for Measuring Transmittance

Using a haze meter ("NDH7000" manufactured by Nippon Denshoku Industries Co., Ltd.), the total light transmittance of a substrate with a functional fine line was measured and taken as transmittance.

(3) Method for Measuring Haze

Using the haze meter, a haze value of a substrate with a functional fine line was measured.

Note that the haze value is calculated by the following formula according to "How to determine haze of plastic-transparent material (JIS K 7136)".

Haze value (cloudiness)=scattered light/total light transmitted light×100(%)

(4) Method for Evaluating Adhesion

A "Cellotape®" manufactured by Nichiban Co., Ltd. was bonded to a surface of a substrate on which a functional fine line had been formed and quickly peeled off in a vertical direction. A surface of the cellotape after peeling and a residual ratio of a functional fine line pattern were observed, and adhesion was evaluated according to the following evaluation criteria.

[Evaluation Criteria]

AA: No peeling occurs on a conductive fine line at all, and there is no transfer onto a cellotape.

A: Transfer from a conductive fine line is observed in a part of a peeled cellotape, but peeling is not observed in a conductive fine line.

B: Transfer from a conductive fine line is observed in the entire surface of a peeled cellotape, but peeling is not observed in a conductive fine line.

C: Peeling of a conductive fine line slightly occurs.

D: Peeling of a conductive fine line largely occurs.

The above results are illustrated in Table 1.

TABLE 1

| | | | Example 1 | Example 2 | Example 3 | Example 4 | Example 5 | Example 6 | Example 7 | Example 8 | Example 9 | Comparative Example 1 | Comparative Example 2 | Comparative Example 3 |
|---|---|---|---|---|---|---|---|---|---|---|---|---|---|---|
| Substrate | | | PET | PET | PET | PET | PET | PET | PC | Glass | COP | PET | PET | PC |
| Composition of undercoat layer (wt %) | Polyester resin (in terms of solid content) | A (siloxane-modified) | 100 | — | — | — | — | — | — | — | — | — | — | — |
| | | B (acrylic modified) | — | 100 | 92 | 92 | — | — | 92 | 92 | 92 | — | — | — |
| | | C (acrylic modified) | — | — | — | — | 100 | — | — | — | — | — | — | — |
| | | D (siloxane-modified) | — | — | — | — | — | 100 | — | — | — | — | — | — |
| | | E (not hydrophobically modified) | — | — | — | — | — | — | — | — | — | 100 | — | — |
| | Crosslinking | Oxazoline-based | — | — | — | 8 | — | — | 8 | 8 | 8 | — | — | — |

TABLE 1-continued

|  |  | Example 1 | Example 2 | Example 3 | Example 4 | Example 5 | Example 6 | Example 7 | Example 8 | Example 9 | Comparative Example 1 | Comparative Example 2 | Comparative Example 3 |
|---|---|---|---|---|---|---|---|---|---|---|---|---|---|
| agent (in terms of solid content) | Carbodiimide-based | — | — | 8 | — | — | — | — | — | — | — | — | — |
| Contact angle conditions | B/A(—) | 0.43 | 0.34 | 0.27 | 0.36 | 0.00 | 0.47 | 0.31 | 0.31 | 0.31 | 0.00 | 0.00 | 0.00 |
|  | Contact angle A (°) | 35 | 29 | 26 | 25 | 19 | 53 | 26 | 26 | 26 | 31 | 33 | 36 |
|  | Contact angle B (°) | 15 | 10 | 7 | 9 | 0 | 25 | 8 | 8 | 8 | 0 | 0 | 0 |
| Evaluation | Line width (μm) | 7.3 | 7.1 | 6.8 | 5.3 | 8.2 | 8.8 | 5.2 | 5.3 | 5.3 | N.G. | N.G. | N.G. |
|  | Transmittance (%) | 83.9 | 84.2 | 84.3 | 85.4 | 83.7 | 83.1 | 85.5 | 85.5 | 85.8 | 81.0 | 79.0 | 82.0 |
|  | Haze (%) | 1.9 | 1.4 | 1.4 | 1.3 | 1.5 | 2.0 | 1.3 | 1.3 | 1.3 | 3.3 | 3.4 | 2.8 |
|  | Adhesion | A | A | A | AA | A | A | AA | AA | AA | B | C | D |

<Evaluation>

It is found that presence of an undercoat layer including a hydrophobically modified polyester resin on a substrate can reduce the line width of a fine line formed on the substrate (on the undercoat layer) to a range of 1 μm or more and 10 μm or less, can make adhesion of the fine line excellent, and furthermore, can make the transmittance of the substrate on which the fine line has been formed high and make the transparency high (make haze low). In other words, it is found that stability of a fine line formed on the substrate, the optical properties of the substrate on which the fine line has been formed, and the like can be improved.

In addition, for example, it is found by comparison between Example 1 and Example 2 that a haze value can be further reduced, for example, by a fact that the hydrophobically modified polyester resin is an acrylic modified polyester resin.

In addition, for example, it is found by comparison between Example 2 and Example 3 that the line width can be further reduced, for example, by inclusion of a crosslinking agent in an undercoat layer.

In addition, for example, it is found by comparison between Example 3 and Example 4 that the line width is further reduced, transmittance is further improved, and adhesion is further improved, for example, by a fact that the crosslinking agent is oxazoline.

In addition, for example, it is found by comparison between Examples 1 and 2 and Examples 5 and 6 that the line width is further reduced, for example, by satisfying, a specific contact angle condition.

In addition, for example, it is found by comparison between Examples 7 to 9 and Comparative Example 3 that the present invention makes adhesion of a fine line excellent even to a substrate which inherently hardly obtains adhesion, for example.

3. Lamination of Metal on Functional Fine Line

Example 10

The functional fine line formed in Example 4 was sequentially subjected to the following electrolytic copper plating and electrolytic nickel plating to sequentially form a copper plating layer and a nickel plating layer on the conductive fine line.

[Electrolytic Copper Plating]

Power was supplied to a conductive fine line pattern immersed in a copper plating bath prepared in a formulation of finishing 60 g of copper sulfate pentahydrate, 19 g of sulfuric acid, 2 g of 1 N hydrochloric acid, and 5 g a gloss agent ("ST901C" manufactured by Meltex, Inc.) to 1000 ml with deionized water to perform electrolytic copper plating. A copper plate for plating was used for an anode.

[Electrolytic Nickel Plating]

Power was supplied to a conductive fine line pattern (conductive fine line pattern after the electrolytic copper plating) immersed in a nickel plating bath prepared in a formulation of finishing 210 g of nickel sulfate, 45 g of nickel chloride, and 30 g of boric acid to 1000 ml with deionized water to perform electrolytic nickel plating. A nickel plate for plating was used for an anode.

<Evaluation>

By laminating a metal using electrolytic plating, it was possible to selectively laminate a metal on a functional fine line.

It was confirmed that conductivity of a fine lire formed of a composite of a functional fine line and a laminated metal was remarkably improved by laminating a metal.

At this time, the metal was laminated mainly in a height direction, and therefore thickening of the functional fine line due to plating was suppressed. As a result, the line width of a fine line formed of a composite of a functional fine line and a laminated metal suitably maintained a sufficiently fine width (preferably 10 μm or less although depending on plating conditions). As a result, the optical properties were maintained favorably. In addition, adhesion was also maintained favorably.

REFERENCE SIGNS LIST

1 Substrate
2 Undercoat layer
3 Ink
4 Functional fine line
5 Parallel lines

The invention claimed is:

1. A substrate with a functional fine line having an undercoat layer including a hydrophobically modified polyester resin on the substrate,
and having a functional fine line including a deposit of functional microparticles and having a line width of 1 µm or more and 10 µm or less on the undercoat layer, wherein
the deposit is derived from an ink containing the functional microparticles, water, and a high boiling point solvent having a higher boiling point than water, and
a surface of the undercoat layer satisfies the following contact angle conditions,
a contact angle of a mixed solution obtained by mixing water and the high boiling point solvent at a weight ratio of 80:20 at 25° C. with respect to a surface of the undercoat layer is represented by A,
and a contact angle of the high boiling point solvent at 25° C. with respect to the surface of the undercoat layer is represented by B,
all of the following formulas (a), (b), and (c) are satisfied:

$$0.1 \leq B/A \leq 2 \quad (a)$$

$$10° \leq A \leq 50° \quad (b)$$

$$5° \leq B \leq 30° \quad (c).$$

2. The substrate with a functional fine line according to claim 1, wherein the hydrophobically modified polyester resin is an acrylic modified polyester resin.

3. The substrate with a functional fine line according to claim 1, wherein the undercoat layer contains a crosslinking agent.

4. The substrate with a functional fine line according to claim 3, wherein the crosslinking agent is an oxazoline-based crosslinking agent.

5. The substrate with a functional fine line according to claim 1, wherein the functional microparticles are metal nanoparticles.

6. The substrate with a functional fine line according to claim 1, wherein the high boiling point solvent is diethylene glycol monobutyl ether.

7. The substrate with a functional fine line according to claim 1, wherein a metal is laminated on the functional fine line.

8. The substrate with a functional fine line according to claim 1, wherein the substrate is polycarbonate, a cycloolefin polymer, polystyrene, or glass.

9. The substrate with a functional fine line according to claim 1, wherein a plurality of the functional fine lines forms a predetermined pattern.

10. A method for forming the substrate with the functional fine line of claim 1, comprising:
forming the undercoat layer including the hydrophobically modified polyester resin on the substrate; and then
forming the functional fine line including the deposit of functional microparticles and having the line width of 1 µm or more and 10 µm or less on the undercoat layer.

11. The method for forming the substrate with the functional fine line according to claim 10, wherein the hydrophobically modified polyester resin is an acrylic modified polyester resin.

12. The method for forming the substrate with the functional fine line according to claim 10, wherein the undercoat layer contains a crosslinking agent.

13. The method for forming the substrate with the functional fine line according to claim 12, wherein the crosslinking agent is an oxazoline-based crosslinking agent.

14. The method for forming the substrate with the functional fine line according to claim 10, wherein the functional microparticles are metal nanoparticles.

15. The method for forming the substrate with the functional fine line according to claim 10, wherein the high boiling point solvent is diethylene glycol monobutyl ether.

16. The method for forming the substrate with the functional fine line according to claim 10, wherein a metal is laminated on the functional fine line.

17. The method for forming the substrate with the functional fine line according to claim 10, wherein the substrate is polycarbonate, a cycloolefin polymer, polystyrene, or glass.

18. The method for forming the substrate with the functional fine line according to claim 10, wherein a predetermined pattern is formed by a plurality of the functional fine lines.

19. The method for forming the substrate with the functional fine line according to claim 10, wherein when the functional fine line is formed, the functional microparticles contained in an ink applied onto the undercoat layer are deposited on an edge part of the ink by utilizing a flow inside the ink to form the functional fine line having a finer width than an application width of the ink.

20. The method for forming the substrate with the functional fine line according to claim 19, wherein when the functional fine line is formed, the functional microparticles contained in an ink applied onto the undercoat layer as a line segment are deposited on both edge parts of the line segment in a longitudinal direction thereof by utilizing a flow inside the ink to form a pair of the functional fine lines each having a finer width than an application width of the ink.

* * * * *